United States Patent [19]

McElroy

[11] Patent Number: 4,493,057
[45] Date of Patent: Jan. 8, 1985

[54] METHOD OF MAKING HIGH DENSITY SEMICONDUCTOR DEVICE SUCH AS FLOATING GATE ELECTRICALLY PROGRAMMABLE ROM OR THE LIKE

[75] Inventor: David J. McElroy, Houston, Tex.

[73] Assignee: Texas Instruments Incorporated, Dallas, Tex.

[21] Appl. No.: 424,124

[22] Filed: Sep. 27, 1982

Related U.S. Application Data

[60] Division of Ser. No. 110,052, Jan. 7, 1980, , which is a continuation-in-part of Ser. No. 923,876, Jul. 12, 1978, Pat. No. 4,184,207, which is a division of Ser. No. 762,613, Jan. 26, 1977, Pat. No. 4,151,021.

[51] Int. Cl.³ .............................................. G11C 11/40
[52] U.S. Cl. ...................................... 365/182; 365/51; 365/185
[58] Field of Search ........................... 365/51, 182, 185

[56] References Cited
U.S. PATENT DOCUMENTS 4,317,273 3/1982 Guterman et al. ................... 365/185
4,363,109 12/1982 Gardner .............................. 365/185
4,432,075 2/1984 Eitan ................................... 365/185

Primary Examiner—Terrell W. Fears
Attorney, Agent, or Firm—John G. Graham

[57] ABSTRACT

An improved method of making a semiconductor device such as an N-channel, double level poly, MOS read only memory or ROM array is provided; the array is of very dense structure and may be electrically programmable by floating gates which are interposed between the gate oxide and control gates formed by polycrystalline silicon or metal row address lines. The electrical programming of the cells is accomplished by applying selected voltages to the source, drain, control gate and substrate. The very dense array results from a simplified manufacturing process generally compatible with standard N-channel silicon gate technology. Parallel strips of gate oxide, polycrystalline silicon, and nitride (functioning as an oxidation mask) are created in one mask step before field oxide is grown, then a perpendicular pattern of conductive strips is etched using a second mask step.

14 Claims, 53 Drawing Figures

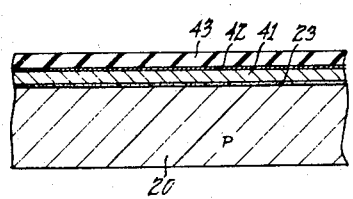
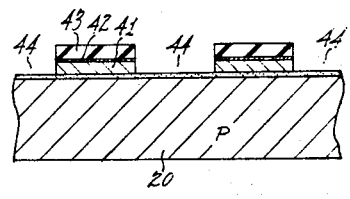
FIG. 5a    FIG. 6a
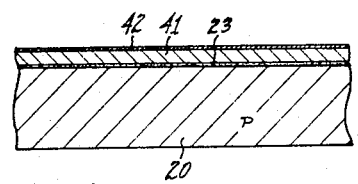
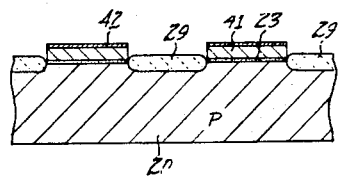
FIG. 5b    FIG. 6b
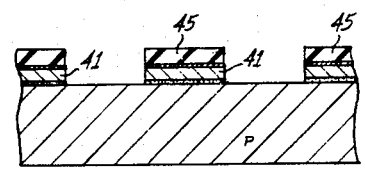
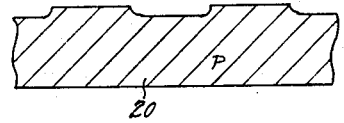
FIG. 5c    FIG. 6c
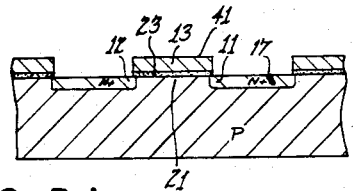
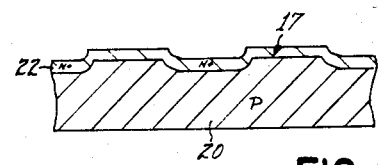
FIG. 5d    FIG. 6d
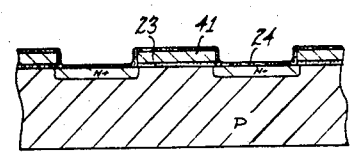
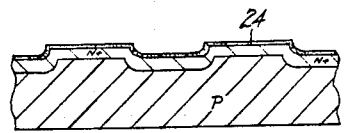
FIG. 5e    FIG. 6e

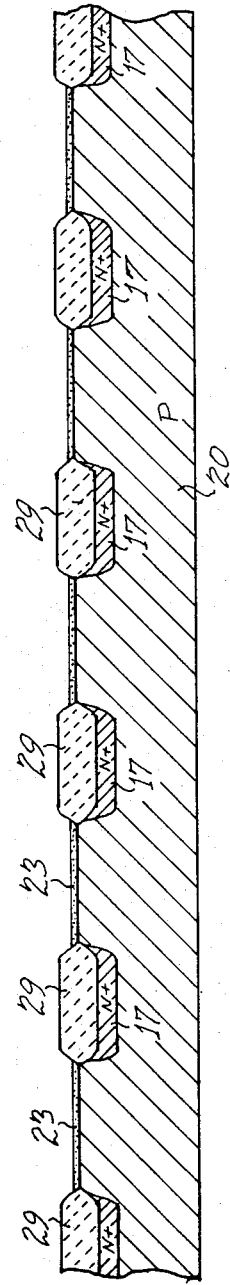
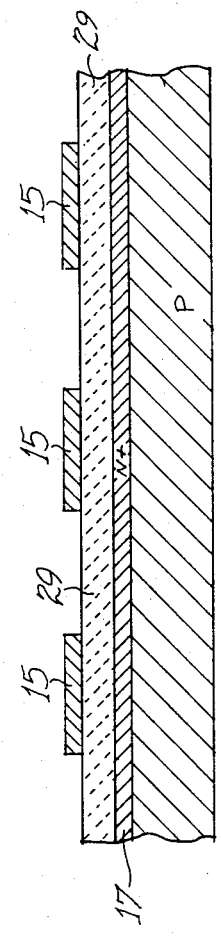
FIG. 9
FIG. 10

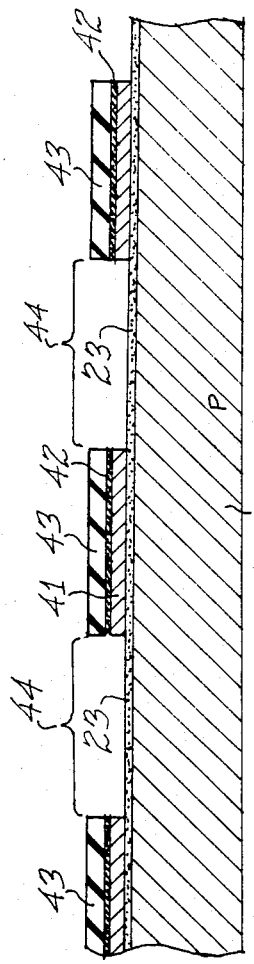
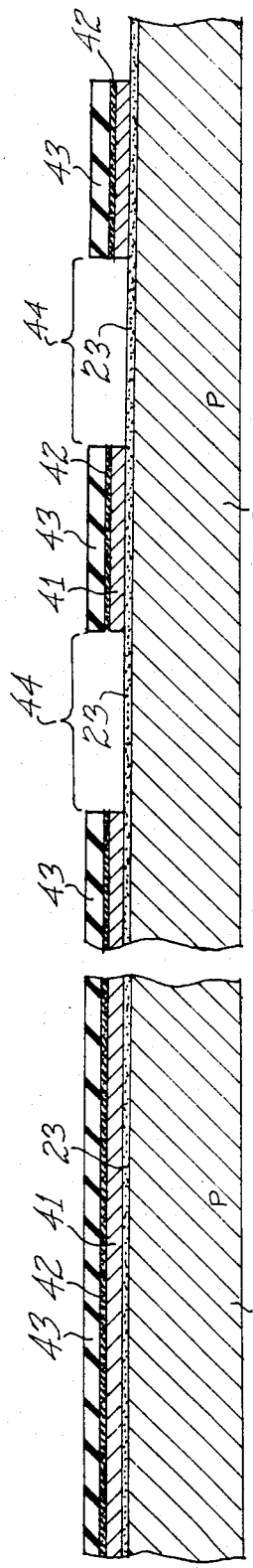
FIG. 16a
FIG. 17a
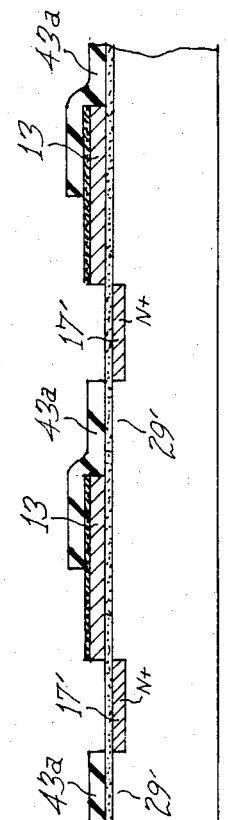
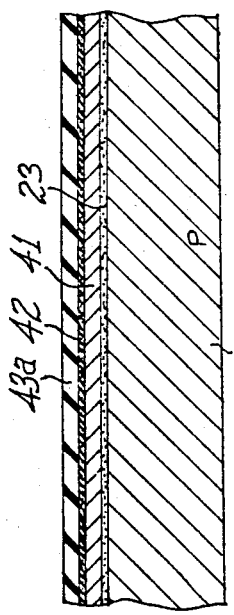
FIG. 16b
FIG. 17b
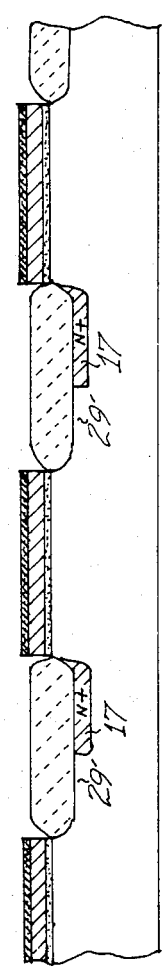
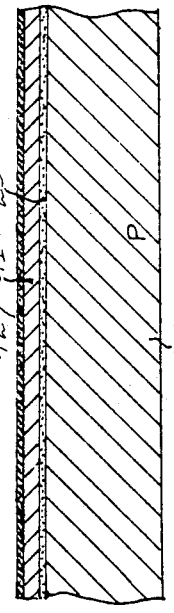
FIG. 16c
FIG. 17c
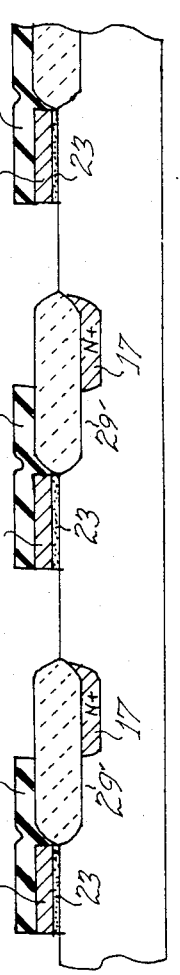
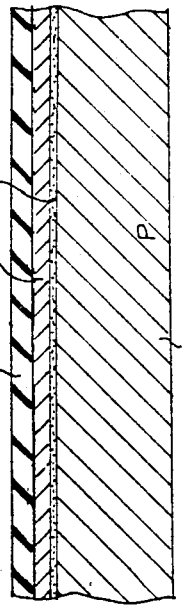
FIG. 16d
FIG. 17d

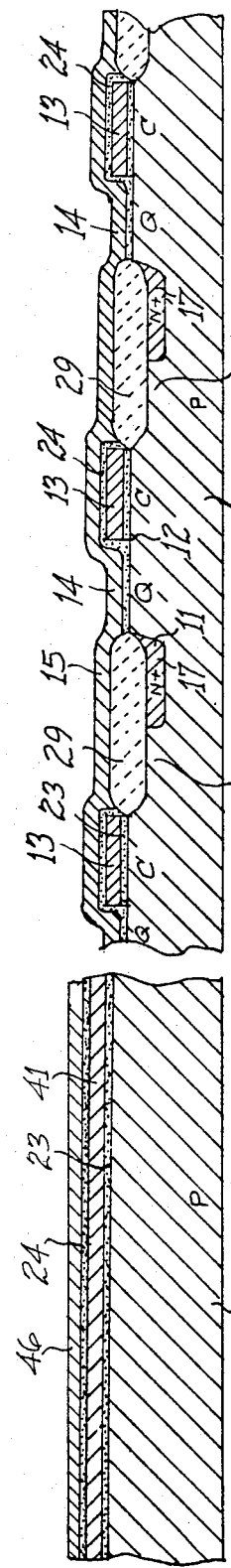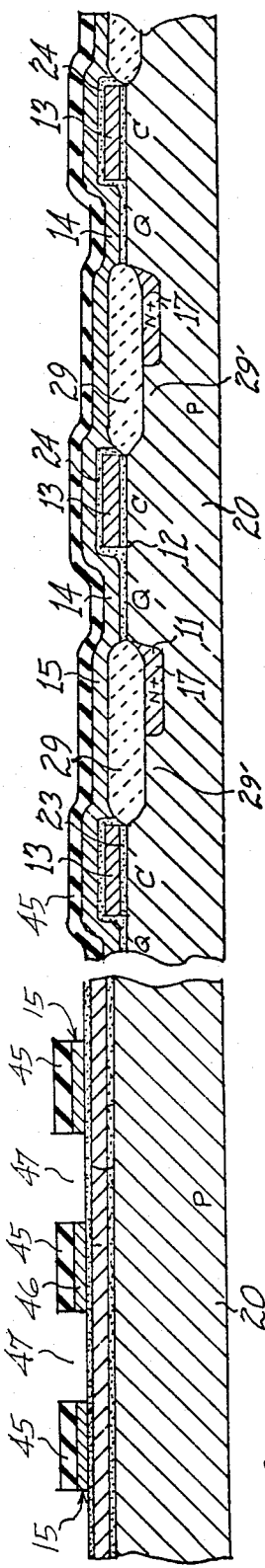
FIG. 16e  FIG. 17e  FIG. 16f  FIG. 17f

METHOD OF MAKING HIGH DENSITY SEMICONDUCTOR DEVICE SUCH AS FLOATING GATE ELECTRICALLY PROGRAMMABLE ROM OR THE LIKE

RELATED CASES

This is a division of application Ser. No. 110,052, filed Jan. 7, 1980, which application is in part a continuation of my prior copending application Ser. No. 923,876, filed July 12, 1978, now U.S. Pat. No. 4,184,207, which was a divisional of my then-copending application Ser. No. 762,613, filed Jan. 26, 1977, now U.S. Pat. No. 4,151,021, both assigned to Texas Instruments.

BACKGROUND OF THE INVENTION

This invention relates to semiconductor memory devices and more particularly to an MOS ROM which is electrically programmable.

Semiconductor memory devices which are nonvolatile have great utility in that the information stored is not lost when the power supply is removed. The most common example of a nonvolatile memory is the MOS ROM wherein the stored information is permanently fixed upon manufacture by the gate level mask or moat mask as set forth in U.S. Pat. No. 3,541,543, assigned to Texas Instruments. Most calculators and microprocessor systems employ ROM's of this type to store a program consisting of a large number of instruction words. However, it would be perferable to be able to program the ROM devices after manufacture, so that all devices would be made the same with no unique masks required. Various electrically programmable ROM devices have been developed such as that shown in U.S. Pat. No. 3,984,822 which employs a floating gate in a double level polysilicon MOS ROM; the floating gate is charged by injection of electrons from the channel, and stays charged for years. Other devices of this type have employed charge storage on a nitride-oxide interface. Electrically alterable ROM's have been developed as set forth in U.S. Pat. No. 3,881,180, issued Apr. 29, 1975, and U.S. Pat. No. 3,882,469, issued May 6, 1975, as well as application Ser. No. 644,982, filed Dec. 29, 1975, all by W. M. Gosney and assigned to Texas Instruments; the Gosney devices are floating gate cells with dual injection (both holes and electrons) so that the gates may be charged or discharged. Other electrically programmable and electrically alterable ROM's are disclosed in copending application Ser. Nos. 754,144, 754,206, 754,207, and 754,208, all filed Dec. 27, 1976 by Lawrence S. Wall or David J. McElroy and assigned to Texas Instruments. However, the prior cells have exhibited some undesirable characteristics such as large cell size, process incompatible with standard techniques, high voltages needed for programming, etc.

It is therefore the principal object of the invention to provide an improved method of making semiconductor devices such as arrays of memory cells, e.g. electrically programmable read-only-memory cells. Another object is to provide a memory cell which is of small cell size when formed in a semiconductor integrated circuit. A further object is to provide a process for making dense arrays of memory cells generally compatible with N-channel silicon gate technology.

SUMMARY OF THE INVENTION

According to the invention, successive layers of gate oxide, polysilicon, and nitride are first applied to a face of a semiconductor body, then at least the nitride is patterned using photoresist, after which field oxide is grown. This contrasts with prior methods because the first level of polysilicon is applied before nitride, not after field oxide is grown.

In accordance with one embodiment of the invention, a floating gate MOS programmable ROM cell is provided which is made by an N-channel, silicon-gate, self-aligned, double level poly process which is generally compatible with standard processing techniques. The floating gate is formed by the first level polysilicon which is isolated from the second level poly by an insulator. The cells are electrically programmed by applying proper voltages to the sources, drains, and gates. A dense array is obtained by a process wherein parallel strips of gate oxide, first level poly, and silicon nitride are formed by depositing these layers and patterning, then field oxide is grown using the nitride as a mask. A pattern of parallel strips, perpendicular to the first strips, is etched to remove the field oxide and parts of the original strips to produce a diffusion mask. The second level poly is applied after the diffusion to create control gates and row lines.

In another embodiment of the invention, an N-type impurity implant is done before the field oxide is grown, using the nitride, polysilicon and photoresist as a mask. Then, after field oxide is grown, these N-type regions create the column lines of the EPROM array. Thereafter, second level polysilicon or metal is applied and patterned in strips perpendicular to the original strips, defining the row lines; an EPROM array is thus defined using essentially only two mask steps.

A further embodiment of the invention forms a random access read/write memory array of the type using one-transistor cells. The capacitors and bias lines are created by the first etch step on the first level polysilicon, and row lines and transistor gates by the etch step on the second level polysilicon. Additional mask steps are needed to separate the capacitors from the N+ column lines, and to remove more of the first level poly over the channels of the access transistors.

THE DRAWINGS

The novel features belived characteristic of the invention are set forth in the appended claims. The invention itself, however, as well as other features and advantages thereof, may best be understood by reference to the following detailed description of illustrative embodiments, when read in conjunction with the accompanying drawings, wherein:

FIGS. 5a–5e are sectional views corresponding to FIG. 2 or 4a showing a cell according to one embodiment of the invention at various stages of manufacture;

FIGS. 6a–6e are sectional views corresponding to FIG. 4d showing the array at successive stages of manufacture;

FIGS. 7a–7f are sectional views similar to FIGS. 5a–5e showing another embodiment of the process of the invention; taken along the line a—a in FIG. 3;

FIGS. 8a–8f are sectional views similar to FIGS. 6a–6e for the embodiment of FIGS. 7a–7f, taken along the line c—c in FIG. 3;

FIG. 9 is an elevation view in section of the device of FIG. 3 taken along the line b—b, made by the process of FIGS. 7a–7f and 8a–8f;

FIG. 10 is an elevation view in section of the device of FIG. 3 taken along the line d—d, made by the process of FIGS. 7a–7f and 8a–8f;

FIG. 11 is a plan view corresponding to FIG. 3 but modified to have dedicated ground lines instead of being a "virtual ground" array;

FIG. 11a is an electrical schematic diagram of the device of FIG. 11, generally corresponding to FIG. 1 but modified as in FIG. 11;

FIG. 12 is an elevational view in section of the device of FIG. 11, taken along the line 12—12 in FIG. 11.

FIGS. 16a–16e are sectional views (generally similar to FIGS. 5a–5e or 7a–7f) of the device of FIG. 14, taken along the line a—a in FIG. 14, at successive stages in the manufacturing process;

FIGS. 17a–17f are elevation views in section (generally corresponding to FIGS. 6a–6e or 8a–8f) of the device of FIG. 14, taken along the line c—c in FIG. 14, at successive stages in the manufacturing process.

DETAILED DESCRIPTION OF SPECIFIC EMBODIMENT

Figure 1:
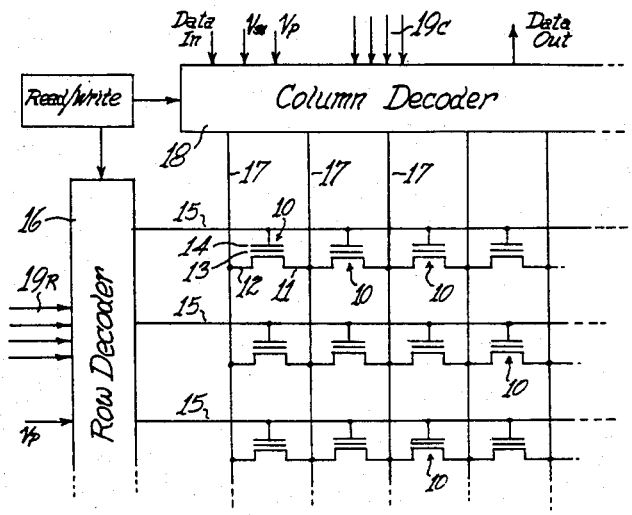
FIG. 1 is an electrical schematic diagram of an array of memory cells according to one embodiment of the invention.

Referring now to FIG. 1, an array of memory cells is shown according to one embodiment. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source and drain electrodes 11 or 12 in a column of cells are connected to a column line 17, and the source and drain column lines 17 are connected at each end to a column decoder 18. In a write or program mode, the column decoder functions to apply either a high voltage (about +25 v.) or a low voltage (ground or Vss, or Vbb, depending upon process) selectively to each source and drain column line 17, in response to a column address on lines 19c and a "0" or "1" data input. For write or program operations, the row decoder 16 functions to apply a high voltage Vp or a low voltage Vss or ground to each of the row lines 15 in response to a row address on lines 19R. For read, the column decoder 18 grounds the line 17 to the right of the selected cell and connects a static load to the column line 17 on the left, using a decode arrangement as in FIG. 14 of U.S. Pat. No. 3,988,604, issued Oct. 26, 1976 to J. H. Raymond, assigned to Texas Instruments; the row decoder 16 applies a logic "1" to Vdd voltage to the selected row line 15 and applies a logic "0" or Vss to all other row lines 15.

Figure 2:
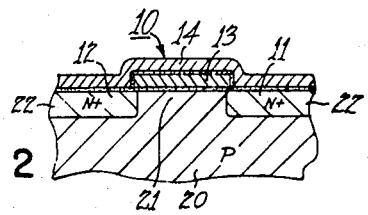
FIG. 2 is an enlarged sectional view of one of the memory cells in the array of FIG. 1.

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 between N+ type regions 22 which are the source 11 and drain 12. The channel region 21 lies beneath the floating gate 13 which is composed of phosphorus-doped polycrystalline silicon. The floating gate 13 is insulated from the underlying channel region 21 by a gate oxide layer 23 which according to the invention is the original thermally-grown silicon oxide of a thickness of perhaps 700 to 1200 Å, as will be described. The control gate 14 is also composed of phosphorus-doped polycrystalline silicon extending beyond the edges of the floating gate 13 as the row line 15. The control gate 14 is isolated from the floating gate by a thermal oxide layer 24 which may be of selected thickness. Generally, according to copending application Ser. No. 754,144 filed Dec. 27, 1976 by L. S. Wall, assigned to Texas Instruments, the thickness of the oxide layer 24 may be selected, depending upon a number of factors such as process variations, desired operating voltages and conditions, and the like, so that charge escapes from the floating gate 13 when the electric field across the oxide layer 24 is high so the device may be electrically deprogrammed, whereas ordinarily this leakage is an undesirable condition; otherwise the oxide layer 24 is made thicker than the gate oxide 23, for example about 2000 Å. The cell is programmed by holding the source 11 at high voltage, Vp about $-25$ v. and the drain 12 at Vss while the control gate 14 is at Vp, whereupon the level of current through the channel 21 is such that electrons are injected through the oxide 23 and charge the floating gate 13. Once charged, the floating gate stays in this condition indefinitely, and subsequently the apparent threshold voltage of the transistor is greatly increased, from perhaps $-5$ to $-11$ volts. The array is deprogrammed by exposing to ultraviolet light.

Figure 3:
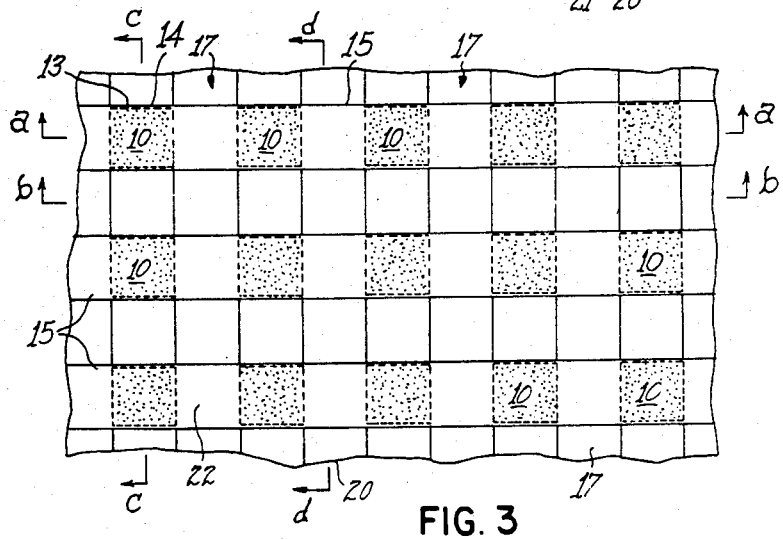
FIG. 3 is a plan view of a part of a semiconductor integrated circuit chip containing an array of the cells of FIGS. 1 and 2.
Figure 4A:
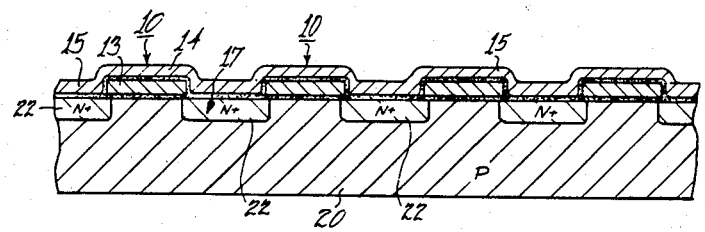
FIGS. 4a–4d are elevation views in section of the array of FIG. 3, taken along the lines a—a, b—b, c—c, and d—d respectively, in FIG. 3.
Figure 4B:
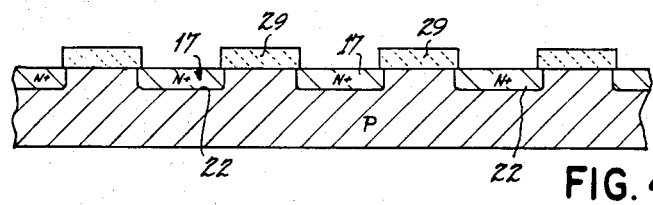
Figure 4C:
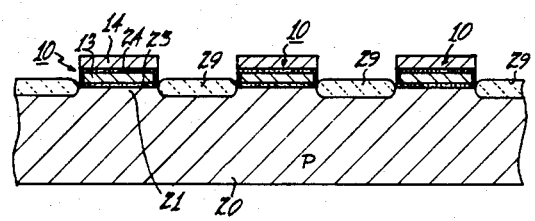
Figure 4D:
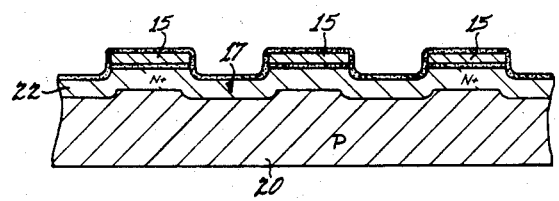

Referring now to FIG. 3, a part of a cell array according to the invention is illustrated. FIGS. 4a to 4d are sectional views of the device of FIG. 3, as is FIG. 2, showing details of construction. The area shown in FIG. 3 is about 0.6 mils by 1.0 mils in size; the entire cell array may contain for example, 65,536 cells ($2^{16}$) or 131,072 cells ($2^{17}$), or other power of two. The twelve transistors 10 for the cells shown are created in three parallel elongated moats forming the rows of cells which have thick field oxide 29 on each side. N+ diffused regions 22 in the moats form interconnections between the cells and the sources and drains of the transistors, creating the rows of cells as well as the column lines 17. Elongated parallel strips of polycrystalline silicon form the address lines 15 and the control gates 14 of the transistors. The floating gates 13 are buried beneath the strips 15. The simplified structure and manufacturing technique of the invention allows the sources, drains, rows and column lines to be formed and interconnected in one diffusion masking operation with a very dense layout.

Turning now to FIGS. 4a–4e and 5a–5e, process for manufacturing the devices described above will be explained. Note that FIGS. 4a–4e correspond to the sectional view of FIGS. 2 or 4a in the finished device, that is to line 2—2 in FIG. 3, while FIGS. 5a–5e correspond to the sectional view of FIG. 4d, that is to the line d—d in FIG. 3.

This is similar to an N-channel, silicon-gate, double level poly process for making MOS integrated circuit devices except that the first level poly is deposited at the beginning. The starting material is a slice of P-type monocrystalline silicon, perhaps 3 inches in diameter and 30 mils thick, cut on the <100> plane, of P-type conductivity doped with boron in growing to a resistivity of about 6 to 8 ohm-cm. In the FIGS. 3–5, the wafer or body 20 represents a very small part of the slice, chosen as representative sample cross sections. First, after appropriate cleaning, the slice is oxidized by exposing to oxygen in a furnace at an elevated temperature of perhaps 1000° C. to produce an oxide layer 23 of a thickness of about 1000 Å; in contrast to prior methods, this layer 23 remains in the finished device as the gate oxide. Next a layer 47 of polycrystalline silicon is deposited over the entire slice in a reactor using standard techniques, for example by decomposition of silane in hydrogen at about 930° C. to a thickness of about one-half micron, producing the polysilicon which will ultimately form the floating gates 13. The layer of poly is subjected to a phosphorus deposition and diffusion to render it highly conductive. This diffusion does not penetrate the substrate 20 (except perhaps at poly to silicon contact areas on other parts of the slice, not shown). Then a layer 42 of silicon nitride $Si_3N_4$ is formed by exposing to an atmosphere of silane and ammonia in an rf reactor. This nitride layer 42 is grown to a thickness of about 1000 Å. Next, the three-layer sandwich is patterned in a plurality of parallel strips corresponding to the rows. To this end a coating 43 of photoresist is applied to the entire top surface, then exposed to ultraviolet light through a mask which defines the desired pattern, and developed. This leaves areas 44 where nitride is to be etched away; these are the areas where field oxide 29 is to be grown. The slice is subjected to an etch sequence, which removes the part of the nitride layer 42 not covered by the photoresist 43, as well as the exposed poly 41 and oxide 23, but does not react with the photoresist 43.

The slice might now be subjected to an ion implant step preferably using another oversized moat mask, whereby boron atoms are implanted in the areas of silicon not covered by photoresist which masks the implant. Boron is an impurity which produces p-type conductivity, so a more heavily doped P+ region will be produced in the surface. The boron implant would be at a dosage of about $4 \times 10^{13}/cm^2$ at 100 KeV. After the implant, the photoresist layer is removed. Thee implanted regions, not shown, would ultimately produce the P+ channel stop regions. Because of the oversized moat mask, the channel stop regions do not touch the N+ regions or channels, so breakdown problems are avoided.

The following step in the process is formation of field oxide, which is done by subjecting the slices to steam or an oxidizing atmosphere at about 900° C. for perhaps 10 hours. As seen in FIG. 6b, this causes a thick field oxide region or layer 29 to be grown, and this region extends into the silicon surface because silicon is consumed as it oxidizes. The nitride layer 42 masks oxidation beneath it. The thickness of this layer 28 may be thinner than in standard processing, perhaps about 4000 to about 8000 Å, half of which is above the original surface and half below. The channel stop implant, if performed, will be partly consumed, but will also diffuse further into the silicon ahead of the oxidation front.

Although not reflected in the FIGURES, ion implant steps may be performed to create the desired threshold or operating parameters in transistors in the integrated circuit, either in the cell array or in the peripheral circuits such as decoders, output buffers, input latches and buffers, clock generators and the like. First, boron may be implanted at 50 KeV to a dosage of about $2.5 \times 10^{11}$ atoms/$cm^2$ for the purpose of adjusting the threshold voltage of thin oxide enhancement mode transistors so that substrate bias voltage will not be needed. Then, a photoresist layer may be applied and patterned to expose the channel areas of depletion load transistors in peripheral circuitry. These areas are then subjected to a phosphorus implant at 150 KeV with a dosage of about $1 \times 10^{12}/cm^2$. This phosphorus implant is selected to produce a compromise of high speed and low power for devices in the peripheral circuits.

Referring to FIG. 6c, the nitride 42, the polysilicon coating 41 and the underlying gate oxide layer 23 are next patterned in a plurality of parallel strips normal to the rows 15 to create the columns. This is done by applying a layer 45 of photoresist, exposing to ultraviolet light through a mask prepared for this purpose, developing, then etching with the remaining photoresist masking strips on the face of the wafer. The resulting structure is seen in FIGS. 5c and 6c, where parts of the remaining polysilicon layer 41 provide what will be the floating gates 13 of the transistors 10; the field oxide 29 is also removed in strips not covered by the photoresist layer 45, where the N+ diffusion will create the column lines 17.

Referring to FIGS. 5d and 6d, using the remain field oxide 29 as well as the polysilicon 41 and its underlying thin oxide 23 as a diffusion mask, the slice is not subjected to an N+ diffusion, whereby phosphorus is deposited and then diffused into the silicon slice 20 to produce the column lines 17, the N+ source and drain regions 11 and 12 as well as the regions 22 in the moats. The depth of diffusion is about 8000 Å. The N+ diffused regions function as conductors which connect the various regions together, and also function as the source or drain regions. The nitride 43 is removed and the exposed silicon surfaces are oxidized after the diffusion, providing an oxide coating 24 over the poly 41 and the silicon surface of FIG. 6e. The layer 24 of silicon dioxide is grown on the silicon and polysilicon, producing a coating on all exposed surfaces of the poly, including tops and sides. The layer 24 is grown at about 900° C. in oxygen for about one hour, producing approximately 2000 Å thickness and consuming part of the polysilicon.

The second level polycrystalline silicon is next deposited over the entire top surface of the slice over the oxide layer 24, using a reaction as above, then subjected to phosphorus diffusion to render it conductive, providing the control gates 14 and row lines or strips 15. The second level poly is patterned using photoresist to define the strips 15, producing the structure of FIGS. 2–5.

A preferred method of making the device of FIGS. 1–4 will now be described with reference to FIGS. 7 and 8. As before, the gate oxide 23, the first layer 41 of polysilicon, and the silicon nitride layer 42 are deposited in a sandwich as seen in FIGS. 7a and 8a, and this three-layer sandwich is patterned in a plurality of parallel strips using a coating 43 of photoresist, leaving areas 44 where nitride 42 and polysilicon 41 are etched away. An arsenic implant is performed, creating regions 17' in the silicon surface as seen in FIG. 8b. These will become the column lines 17 in the finished device. The photoresist 43 is removed, and the field oxide 29 is next grown by the same process step as referred to above in relation to FIG. 6b, to produce the structure seen in FIG. 8c. The implanted arsenic diffuses ahead of the oxidation front to create the column lines 17 beneath the field oxide 29. The nitride layer 42 is now removed by an etchant which attacks nitride but not silicon or silicon oxide, and the thin interlevel oxide 24 seen in FIGS. 7d and 8d is thermally grown by the same type of step discussed above in connection with FIGS. 5e and 6e. This oxide 24 covers all of the exposed surface of the first level polysilicon 41 which at this point is in the form of parallel strips. Next, a second layer 46 of polycrystalline silicon is deposited on top of the interlevel oxide 24 as seen in FIGS. 7e and 8e, and a coating 45 of photoresist applied over the second level poly. The photoresist 45 is exposed to light through a mask which is similar to that used to expose the photoresist 43 but rotated 90°, then developed to leave strips of photoresist which provide an etch mask having elongated holes 47 perpendicular to what were the first openings 44. Turning to FIGS. 7f and 8f, the next step is etching away the second level polysilicon 46, the oxide 24, and the first level polysilicon 41 in the openings 47. In this sequence of steps, no critical alignment of masks is needed. All four of the edges of the first level polysilicon floating gates are self-aligned, two with the edges of the second level polysilicon control gate strips and the other two with the strips of field oxide 29.

The views seen in FIGS. 7f and 8f are the sections a—a and c—c of FIG. 3. The second level polysilicon 46 which remains after etching creates the row lines 15 and control gates 14, while the remaining squares of first level polysilicon 41 create the floating gates 13. The N+ regions under the field oxide 29 are the column lines 17. Section views of FIG. 3 corresponding to FIGS. 4b and 4d, but made by the process of FIGS. 7 and 8, are seen in FIGS. 9 and 10; that is, FIG. 9 is a section through line b—b of FIG. 3 (made using the process of FIGS. 7 and 8), and FIG. 10 is a section through line d—d of FIG. 3 (made using the process of FIGS. 7 and 8).

The device of FIG. 3 made by the process of FIGS. 7 and 8 is defined by the circuit diagram of FIG. 1 as before. The resistance of the lines 17 is such that programming is slow; techniques such as shown in my copending application Ser. No. 080,712, filed Oct. 1, 1979, may be used to enhance programming. That is, capacitive discharge of the lines 17 in a series of pulses is employed to generate the programming current in the source-to-drain path of a selected cell 10. This technique is slow because time must be allowed for charging of the selected column line, repeated if several pulses are needed. Thus, it may be preferable to employ a conventional array as seen in FIG. 11 instead of a virtual ground array of FIG. 1. Dedicated ground lines 17a are provided between each pair of output lines 17. To produce this structure, the array of FIG. 3 is subjected to an additional mask and etch step using photoresist which allows every third column of cells 10 to be eliminated. To this end, after implanting the regions 17' of FIG. 8b, and before the field oxide growth of FIG. 8c, the additional mask and etch step removes the nitride 42 and underlying polysilicon 41 from every third column; the alignment of this mask is non-critical since it may overlap the areas 44 without detrimental effects. Where the nitride 42 is removed, the field oxidation step will grow oxide 29 and no cells 10 will subsequently be formed. However, no N+ implant is beneath this part of the field oxide so the adjacent column lines 17 on opposite sides will be isolated from one another. The resulting finished structure is seen in section in FIG. 12, which corresponds to FIG. 8f. When constructed in the manner of FIGS. 11 and 12, the bit density of the array is reduced by one-third, but still the density is much greater than that of an EPROM made by the process of U.S. Pat. No. 3,984,822.

The EPROM thus far described utilizes polycrystalline silicon as the second level insulator, but another metal such as aluminum could be used instead. Aluminum has the advantage of lower resistivity than polysilicon. The aluminum would be deposited and patterned by conventional process steps in place of the deposition and patterning of second level polysilicon described above. After the aluminum is etched, the then-exposed segments of oxide and poly would be removed by a different etchant.

The field oxide 29 of FIGS. 7-10 functions to reduce the capacitive coupling between the row address lines 15 and the column lines 17. The thickness of this field oxide is selected as a compromise between the reduced coupling factor and the enroachment of field oxide into the moat areas which occurs for lengthy oxidation steps. Thus, perhaps 2000 or 3000 Å is optimum. If high capactive coupling can be tolerated in the circuit design, e.g. in low speed devices, then the oxide 29 may be only about 1000 Å, in which case the nitride oxidation mask layer 42 is not needed; an arsenic implant produces the regions 17' after first level polysilicon is patterned (see FIG. 8b), and the oxide layer 29 is grown to perhaps 1000 Å during a diffusion or drive-in step at perhaps 1000° C., at which time a part of the surface of the first level polysilicon is also oxidized to create the interlevel oxide 24.

Figure 14:
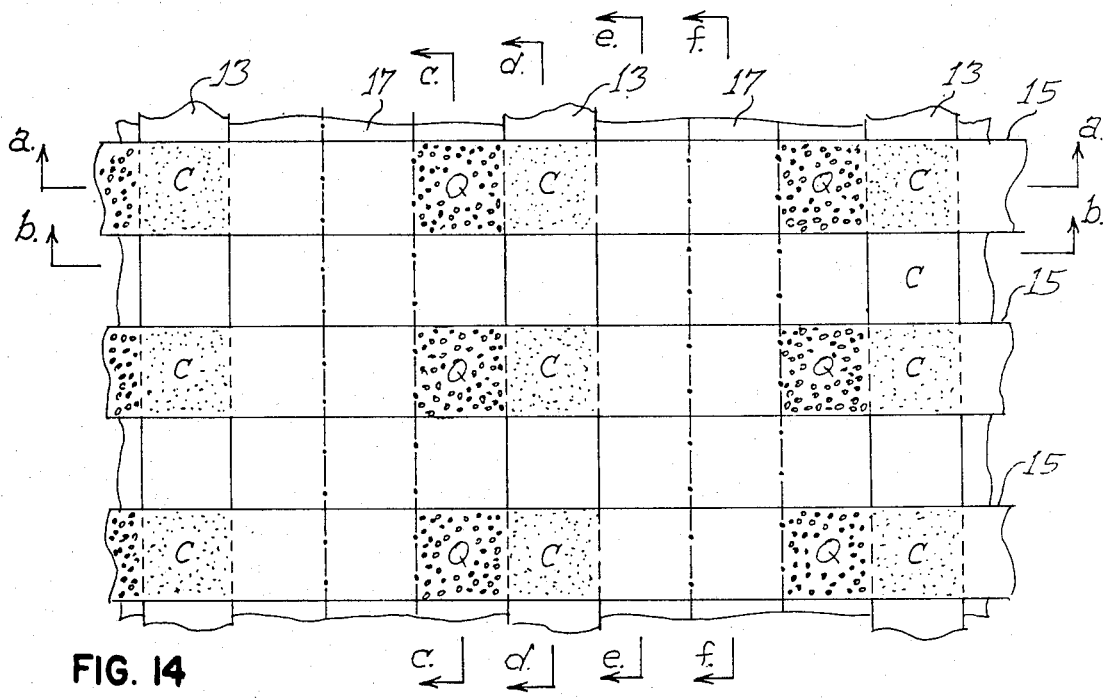
FIG. 14 is a plan view of a cell array according to the embodiment of FIG. 13.
Figure 13:
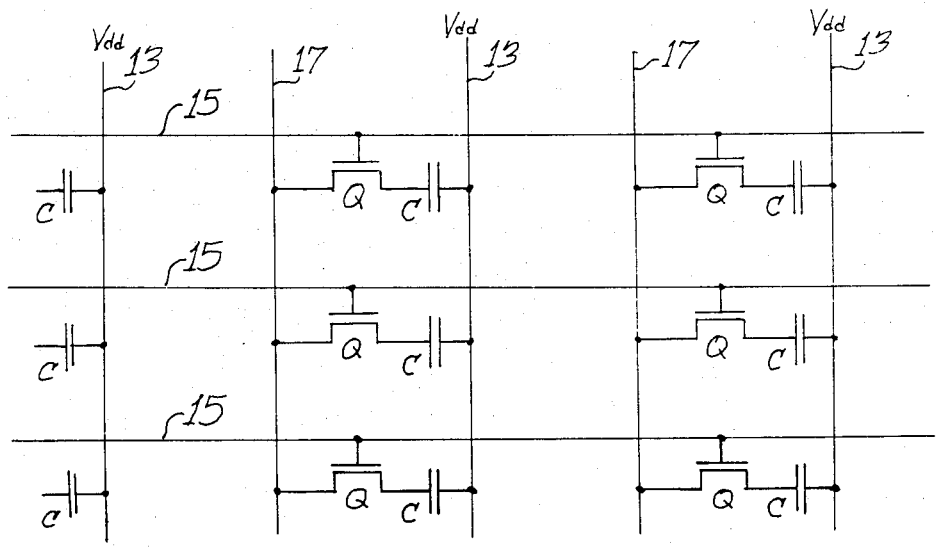
FIG. 13 is an electrical schematic diagram of a random access read/write memory array using one-transistor cells, made by another embodiment of the invention.
Figure 15A:
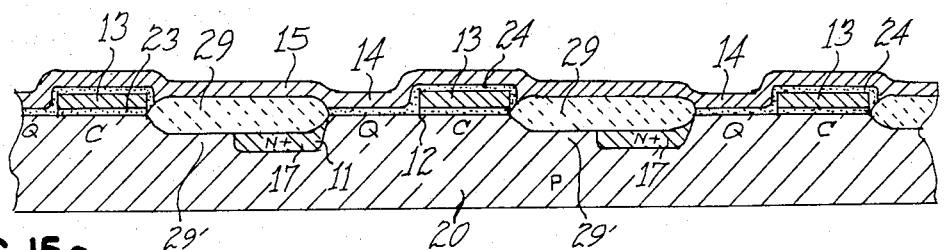
FIGS. 15a–15f are elevation views in section of the device of FIGS. 13 and 14, taken along the lines a—a through f—f, respectively, in FIG. 14.
Figure 15B:
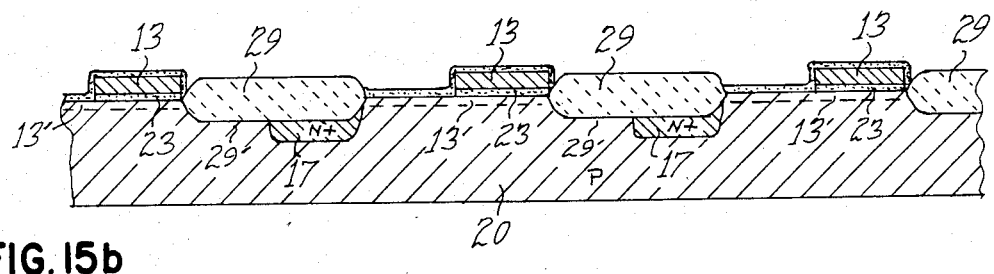
Figure 15C:
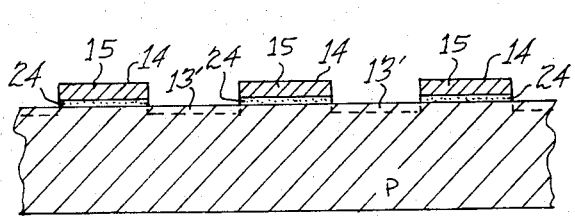
Figure 15D:
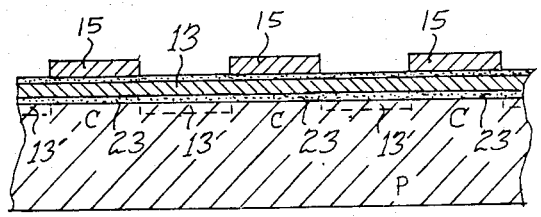
Figure 15E:
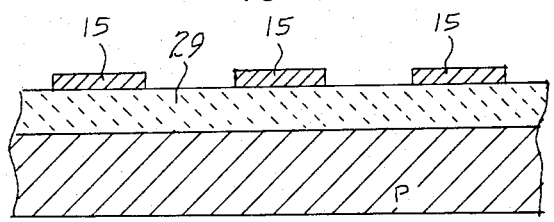
Figure 15F:
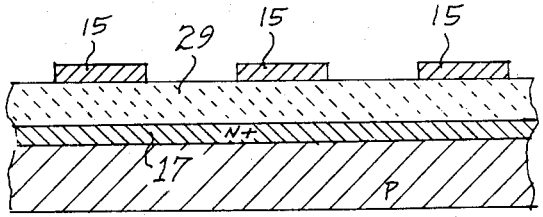

Referring to FIGS. 13 and 14, and the sectional views of FIGS. 15a-15d, an array of dynamic RAM cells is shown which is made by the method of one embodiment of the invention. Each cell includes a transistor Q and a capacitor C, with the gates 14 of the transistors being created by elongated second level polysilicon strips 15 and the source regions of the transistors being created by elongated N+ bit lines 17. The capacitors C are biased by a supply voltage Vdd connected to an elongated strip of first level polysilicon 13. The oxide 23 is the capacitor dielectric, and thin oxide 24 creates the gate insulator for the transistors Q and the interlevel insulator between first and second level polysilicon as before. Field oxide 29 covers the bit lines 17. Implanted P+ regions 13' beneath the strip 13 between cells prevent the lower plates of the capacitors from being shorted together; these regions 13' are created by a high energy phosphorus implant done after the strips 15 are defined by etching, with the photoresist 45 still in place so the transistors Q are not affected but phosphorus penetrates the areas of strips 13 between cells.

A method of making the RAM cell array of FIGS. 13, 14 and 15a-15f is seen in FIGS. 16a-16f, 17a-17f, which correspond generally to FIGS. 7 and 8. The width of strips of photoresist 43 and spaces 44 are about twice as wide as the width of the strips of photoresist 45 to allow space for the transistor and for an isolating area 29' where no N+ is beneath the field oxide 29. An additional photoresist mask 43a is needed as seen in FIG. 17b to limit the N+ arsenic implant to create the isolating area 29'. Another mask 43b see in FIG. 17d is needed for etching away half of the remaining first level polysilicon 41 to leave the capacitor upper plate but to leave nothing over the transistor area. With present "direct step on wafer" technology, the alignment tolerance is much better than the line width resolution, so alignment of masks for forming these two photoresist masks 43a, 43b is not unduly difficult. That is, if the minimum line width is 3 microns, the alignment tolerance may be ½ micron or less, which would provide perhaps low but yet acceptable yield.

Thus, the steps of the process for making the device of FIGS. 13-15 include first the deposition of thermal oxide 23, first level poly 41 (and N+ doping of this poly) and nitride 42 as seen in FIGS. 16a and 17a, then deposition of photoresist 43 and opening elongated holes 44. The photoresist 43 is removed, then another layer 43a of photoresist applied and patterned as seen in FIG. 17b, after which an N+ implant step produces the regions 17', leaving the areas 29' not implanted. The field oxide 29 is next grown as seen in FIG. 17c, after which the nitride 42 is removed. As mentioned above, if the field oxide 29 is not to be over about 1000 Å, the nitride may be omitted. As seen in FIGS. 16d and 17d, another layer 43b of photoresist etch mask is deposited and patterned for the purpose of etching away half of the remaining poly layer 41 over the transistors Q to leave only the strips 13. Next, oxide 24 is grown and the layer 46 of second level poly is deposited as seen in FIGS. 16e and 17e and an N+ implant dopes the poly to make it conductive. Then, a layer 45 of photoresist is deposited and patterned as seen in FIG. 16f to leave elongated holes 47 which will define the row lines 15 and act as an implant mask to make the P+ implants 13'.

In the embodiment of FIGS. 13-15, only the second level poly is etched away between the strips formed by the photoresist 45, in contrast to the embodiment of FIGS. 7 and 8 where both first and second level poly is etched through. This is readily accomplished because of the intervening oxide 24 which acts as an etch stop; to continue through both layers in FIG. 7f the initial polysilicon etchant is supplemented by a silicon oxide etchant to remove the layer 24, then etching of the first level poly continues. To make the structure of FIGS. 13-15, on the other hand, etching is stopped when the oxide 24 is reached.

As discussed above, aluminum may be used instead of the second level polysilicon in constructing the device of FIGS. 13-15. Also, the thickness of the field oxide layer 29 is determined by the isolation needed between the row lines 15 and column lines 17. If high capacitive coupling is acceptable, the field oxide may be only perhaps 1000 Å, but it is possible that about 3000 be used.

The process of the invention can be used to make a ROM instead of an EPROM. By omitting the first level polysilicon layer in the process of FIGS. 7 and 8, a device is constructed which is just like that of FIGS. 3, 7f, 8f, and 9 and 10, but without the floating gate 13 or oxide 24. Without the floating gate, of course the device cannot be electrically programmed; as set forth in my copending application Ser. No. 106,126, filed Dec. 21, 1979, the ROM device is programmed by selective ion implant through the polysilicon gates 14. The ROM may be of the virtual ground type of FIGS. 1 and 3, or the dedicated ground type of FIGS. 11 and 11a. Alternatively, instead of implant through poly programming, more conventional moat programming could be used to make this type of ROM, in which case the mask used to pattern the silicon nitride layer 42 would be used to define the ROM code, i.e., where transistors were to be formed and where not; in this case, aluminum may be used for the row lines 15 instead of polysilicon. As another alternative, field oxide 29 could be formed in all potential transistor locations then selectively removed as set forth in my U.S. Pat. No. 4,151,020 in locations where functioning transistors are to exist.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A floating gate type semiconductor memory array comprising: a plurality of MOS transistor devices each having a source, a drain, a floating gate, and a control gate, the floating gate being isolated from the channel between source and drain by thin insulator and the control gate being isolated from the floating gate by thin insulator, the transistor devices being arranged in an array of rows and columns, with the columns of transistor devices being separated by elongated parallel heavily-doped regions in the semiconductor which define column lines; means connecting the control gates of all device in each row together to provide row lines; said elongated parallel heavily-doped semiconductor regions forming the source and drain regions of the transistor devices as well as connecting the sources and drains of all adjacent devices together to provide said column lines, one pair of opposite parallel edges of the floating gate in each transistor device being aligned with edges of the control gates of all transistor devices in each row, and the other pair of opposite parallel edges of the floating gate in each transistor device being aligned with edges of the elongated parallel heavily-doped regions.

2. A memory array according to claim 1 wherein the transistor devices are N-channel and the floating gate and control gate are separate layers of polycrystalline silicon.

3. A memory array according to claim 1 wherein said elongated parallel heavily-doped regions underlie thick field oxide penetrating into said face.

4. A memory array according to claim 3 wherein the thick field oxide is thermally grown silicon oxide in parallel strips between the columns of transistor devices.

5. A memory array according to claim 3 wherein the thick field oxide is aligned with said other pair of opposite parallel edges of the floating gates of the transistor devices.

6. A semiconductor memory array formed in a face of a semiconductor body comprising: a plurality of MOS transistor devices, each transistor device having a source-to-drain path and a gate, the gate being isolated from the source-to-drain path by thin insulator; a plurality of MOS capacitor devices, one for each transistor device, each capacitor device having an upper electrode isolated from a surface region by thin insulator; the transistor devices and capacitor devices being arranged in an array of rows and columns; a plurality of elongated parallel heavily-doped regions in the face which define column lines; means connecting said gates of all devices in each row together to provide row lines; each of said elongated parallel heavily-doped semiconductor regions forming one end of the source-to-drain paths of the transistor devices as well as connecting said one end of all transistor devices in a column together to provide said column lines, one pair of opposite parallel edges of the gate in each transistor device being aligned with edges of the source-to-drain path of such transistor device, and the other pair of opposite parallel edges of the gate in each transistor device being aligned with an edge of one of the elongated parallel heavily-doped regions one one side and the upper electrode of the associated capacitor device on the other side.

7. A memory array according to claim 6 wherein the transistor devices are N-channel and the upper electrode and gate are separate layers of polycrystalline silicon.

8. A memory array according to claim 1, wherein said elongated parallel heavily-doped regions underlie thick field oxide penetrating into said face.

9. A memory array according to claim 8 wherein the thick field oxide is thermally grown silicon oxide in parallel strips wider than the heavily-doped regions.

10. A memory array according to claim 9 wherein the thick field oxide is aligned on one side with said upper electrodes which define elongated strips perpendicular to the row lines.

11. A memory device comprising an array of rows and columns of dynamic memory cells in a face of a semiconductor body of one conductivity type, each cell having a transistor with a source-to-drain path in said face and a gate overlying said face, the source-to-drain path including a region of opposite conductivity type in said face, each cell having a capacitor with a capacitor region in said face and a capacitor plate overlying the capacitor region separated therefrom by an insulator of a given thickness, the capacitor plate for a plurality of the cells being part of a continuous layer of conductive material extending along said face, a given one of the capacitor regions being isolated along the face from an adjacent capacitor region by a doped surface region in the face beneath the layer composed of semiconductor material of said one conductivity type of concentration much greater than that immediately underlying such surface region and differing from that of the capacitor region, the layer being separated from said surface region by an insulator of about said given thickness.

12. A device according to claim 11 wherein said conductive material is polycrystalline silicon, said semiconductor body is P type silicon, and said surface region is P+ silicon.

13. A device according to claim 12 wherein field oxide much thicker than said given thickness and extending into the face functions to isolate at least one side of each capacitor from one of said regions of opposite conductivity.

14. A device according to claim 11 wherein said doped surface region has a surface in the same plane with surface of said adjacent capacitor region, and said layer extends along the face in a single plane from said one capacitor region to said adjacent capacitor region.

* * * * *